ID [19]

United States Patent
Yamamoto et al.

[11] Patent Number: 5,413,959
[45] Date of Patent: May 9, 1995

[54] METHOD OF MODIFYING TRANSPARENT CONDUCTIVE OXIDE FILM INCLUDING METHOD OF MANUFACTURING PHOTOVOLTAIC DEVICE

[75] Inventors: Yasuaki Yamamoto; Hiroshi Hosokawa; Wataru Shinohara; Seiichi Kiyama, all of Moriguchi, Japan

[73] Assignee: Sayno Electric Co., Ltd., Osaka, Japan

[21] Appl. No.: 119,879

[22] Filed: Sep. 10, 1993

[30] Foreign Application Priority Data

Sep. 14, 1992 [JP] Japan .................. 4-244765
Jun. 22, 1993 [JP] Japan .................. 5-150422

[51] Int. Cl.⁶ .................. H01L 31/18; H01L 27/14
[52] U.S. Cl. .................. 437/174; 437/181; 136/256
[58] Field of Search .................. 437/173, 174, 181; 136/244, 256

[56] References Cited

U.S. PATENT DOCUMENTS

| | | | |
|---|---|---|---|
| 4,500,743 | 2/1985 | Hayashi | 136/258 |
| 4,700,463 | 10/1987 | Hama | 437/2 |
| 4,706,376 | 11/1987 | Yamazaki et al. | 437/4 |
| 4,724,011 | 2/1988 | Turner et al. | 136/249 |
| 4,824,488 | 4/1989 | Sakai et al. | 136/244 |
| 5,057,244 | 10/1991 | Nitta et al. | 252/501.1 |
| 5,217,921 | 8/1993 | Kaido et al. | 437/173 |

FOREIGN PATENT DOCUMENTS

| | | |
|---|---|---|
| 57-123606 | 8/1982 | Japan . |
| 58-21878 | 2/1983 | Japan . |
| 61-96775 | 5/1986 | Japan . |
| 61-164273 | 7/1986 | Japan . |
| 61-216489 | 9/1986 | Japan . |
| 61-241983 | 10/1986 | Japan . |

OTHER PUBLICATIONS

IEEE, 1988, "Hydrogen Plasma Durability of SnO$_2$: F Films for Use in a-Si Solar Cells" by Kazuo Sato et al.

Primary Examiner—Olik Chaudhuri
Assistant Examiner—Ken Horton
Attorney, Agent, or Firm—W. G. Fasse; W. F. Fasse

[57] ABSTRACT

In a method of modifying a transparent conductive oxide film and in a method of manufacturing a photovoltaic device, a transparent conductive oxide film is irradiated with an energy beam for increasing the carrier concentration and thereby reducing the resistance of the transparent conductive oxide film.

20 Claims, 12 Drawing Sheets

METHOD OF MODIFYING TRANSPARENT CONDUCTIVE OXIDE FILM INCLUDING METHOD OF MANUFACTURING PHOTOVOLTAIC DEVICE

BACKGROUND OF THE INVENTION

1. Field of the Invention

The present invention relates to a method of modifying a transparent conductive oxide film that can be used for a photovoltaic device or the like, and a method of manufacturing a photovoltaic device using such a modifying method.

2. Description of the Background

A transparent conductive oxide film, which is typically made of tin oxide, indium tin oxide or the like, is widely used to make a display element such as a liquid crystal display or a photovoltaic device such as a solar cell or an optical sensor.

In the field of photovoltaic devices, various strict performance conditions are required for such a transparent conductive oxide film in relation to electric characteristics, optical characteristics, and morphological characteristics of the film surface.

FIG. 12 is a sectional view showing an exemplary element structure of a photovoltaic device. Referring to FIG. 12, a transparent conductive oxide film 122 of tin oxide or indium tin oxide is formed on a transparent substrate 121 of glass or quartz. A photoelectric conversion layer 123 carrying out a photoelectric conversion function of the photovoltaic device is formed on the transparent conductive oxide film 122. This photoelectric conversion layer 123 is formed by a laminate of a p-type semiconductor layer 123p, an i-type semiconductor layer 123i and an n-type semiconductor layer 123n, which are parallel to the film surface. An electrode film 124 is formed on the photoelectric conversion layer 123.

Light 125, which is incident upon this photovoltaic device successively through the substrate 121 and the transparent conductive oxide film 122, is absorbed by the photoelectric conversion layer 123, to be extracted to the exterior as optical carriers consisting of electrons and holes from the electrode film 124 and the transparent conductive oxide film 122 respectively.

In such a photovoltaic device, a texture is formed on a surface 122a of the transparent conductive oxide film 122 as shown in FIG. 12. The transparent conductive oxide film 122 is made of tin oxide or indium tin oxide, which is structured as an aggregate of crystal grains of an oxide, whereby the shapes of these crystal grains are reflected on the surface shape of the transparent conductive oxide film 122, to form the above-mentioned texture. Therefore, the texture is already observed on the surface 122a of the transparent conductive oxide film 122 upon formation thereof. The degree of the texture that is formed on the surface 122a is strongly dependent on film forming conditions for the transparent conductive oxide film 122.

This texture has an important role on the light absorbing function of the photovoltaic device. Namely, an optical path of the light 125, which is perpendicularly incident upon the substrate 121 having a flat surface, for example, is bent along the texture formed on the surface 122a of the transparent conductive oxide film 122 in such a manner that the light 125 passes through the photoelectric conversion layer 123 obliquely to the direction of its thickness. Thus, it is possible to effectively increase the optical length as compared with incident light that passes through the photoelectric conversion layer 123 in parallel with the direction of its thickness, thereby increasing the quantity of light absorption in the photoelectric conversion layer 123.

Such an increase of the light absorption quantity caused by the texture formed on the surface of the transparent conductive oxide film is not restricted to the photovoltaic device having the structure shown in FIG. 12, but is also attained in a photovoltaic device comprising a substrate, a photoelectric conversion layer formed on the substrate and a transparent conductive oxide film formed on the photoelectric conversion layer for receiving light from the transparent conductive oxide film and photoelectrically converting the same.

Such a photovoltaic device is described in detail in Japanese Patent Laying-Open No. 61-96775 (1986) or 61-241983 (1986), for example.

In order to improve the photoelectric conversion efficiency, which is an index indicating total characteristics of a photovoltaic device, a transparent conductive oxide film must satisfy the following three requirements. First, the film must have high transmittance, in order to transmit incident light toward a photoelectric conversion layer with no loss. Second, the film must have the minimum resistance, in order to serve as an electrode for extracting optical carriers. Third, the film must have a proper shape of texture on its surface, in order to effectively bend the optical path of incident light as described above.

In general, however, it has been extremely difficult to obtain a transparent conductive oxide film that satisfies these requirements. This is particularly true because the conditions for forming the transparent conductive oxide film are related to these three characteristics by a complicated relationship.

SUMMARY OF THE INVENTION

A principal object of the present invention is to provide a modifying method that can reduce the resistance of a transparent conductive oxide film with no reduction in the transmittance.

Another object of the present invention is to provide a modifying method that can attain an optimum shape of texture on a surface of a transparent conductive oxide film.

Still another object of the present invention is to provide a method of manufacturing a photovoltaic device using such a method of modifying a transparent conductive oxide film.

A method of modifying a transparent conductive oxide film according to the present invention comprises a step of preparing a unit or device for emitting an energy beam, and a step of irradiating a transparent conductive oxide film with the energy beam emitted from the unit or device, thereby improving, i.e. increasing the carrier concentration in the film.

A method of manufacturing a photovoltaic device according to the present invention comprises a step of forming a transparent conductive oxide film on a substrate, a step of irradiating the transparent conductive oxide film with an energy beam for increasing the carrier concentration in the film, a step of forming a photoelectric conversion layer having at least one p-n junction on the transparent conductive oxide film, and a step of forming an electrode film on the photoelectric conversion layer.

Another method of manufacturing a photovoltaic device according to the present invention comprises a step of forming an electrode film on a substrate, a step of forming a photoelectric conversion layer having at least one p-n junction on the electrode film, a step of forming a transparent conductive oxide film on the photoelectric conversion layer, and a step of irradiating the transparent conductive oxide film with an energy beam thereby increasing the carrier concentration in the film.

According to the present invention, the p-n junction provided in the photoelectric conversion layer includes a p-i-n junction having an i-layer between p- and n-layers.

According to the present invention, the energy beam used to irradiate the transparent conductive oxide film is preferably not more than 400 nm in wavelength. If the wavelength of the energy beam exceeds 400 nm, the effect of reducing resistance of the transparent conductive oxide film may be insufficient.

According to the present invention, further, the intensity of the energy beam is preferably within a range of 0.1 to 1.0 J/cm$^2$. If the intensity of the energy beam is out of this range, no reduction in resistance of the transparent conductive oxide film may be achieved.

According to the present invention, it is possible to increase the carrier concentration in the transparent conductive oxide film by irradiating the film with the energy beam, thereby reducing the resistance of the transparent conductive oxide film.

When a texture has previously been formed on the surface of the transparent conductive oxide film, it is possible to soften the degree of such texture by irradiating the transparent conductive oxide film with the energy beam according to the present invention, thereby attaining an optimum degree of the texture.

When the transparent conductive oxide film initially has a flat surface, on the other hand, it is possible to irradiate the surface of the transparent conductive oxide film with the energy beam according to the present invention for photo-etching the surface by ablation and thereby forming a texture, thereby improving the photoelectric conversion efficiency.

Further, it is possible to irradiate a part of the transparent conductive oxide film with the energy beam for reducing the resistance of the irradiated part, so that this part serves as a collector electrode for collecting carriers.

In addition, it is possible to, reduce the series resistance of a photovoltaic device by irradiating a transparent conductive oxide film forming the device with an energy beam according to the present invention for increasing the carrier concentration in the film and reducing its resistance. Thereby a photocurrent is increased and a curved factor is improved so as to improve the photoelectric conversion efficiency of the device.

The forgoing and other objects, features, aspects and advantages of the present invention will become more apparent from the following detailed description of the present invention when taken in conjunction with the accompanying drawings.

DESCRIPTION OF THE PREFERRED EXAMPLE EMBODIMENTS AND OF THE BEST MODE OF THE INVENTION

Figure 1:
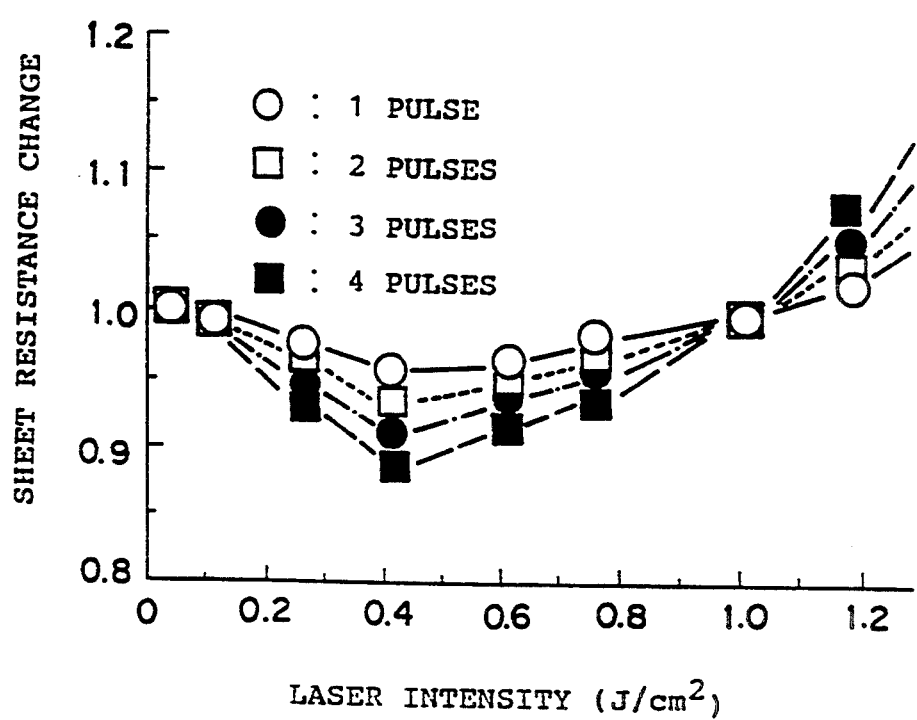
FIG. 1 is a graph illustrating relations between laser intensity levels and changes of sheet resistance values of transparent conductive oxide films irradiated with laser beams according to the present invention.

FIG. 1 illustrates relations between intensity levels of ArF excimer laser beams that were irradiated onto transparent conductive oxide films according to the present invention and resulting changes of sheet resistance values of the transparent conductive oxide films. Referring to FIG. 1, the axis of abscissas shows the laser intensity levels, and the axis of ordinates shows the changes of the sheet resistance values of the transparent conductive oxide films irradiated with the laser beams at respective intensity levels. Each of the transparent conductive oxide films employed as samples were prepared from a tin oxide film, which was formed under well-known film forming conditions with a raw material gas of $SnCl_4$ or $Sn(CH_3)_4$ and a doping gas of $CF_3Br$ or $CHClF_2$ by thermal CVD to attain a doping rate of 0.5 to 1.0 percent by weight. Such a tin oxide film, which has a thickness of about 4000 to 6000 Å in general, was formed with a thickness of about 4000 Å in this example.

Changes of the sheet resistance values were evaluated on the basis of, i.e. by comparison with, the sheet resistance measured in advance of irradiation with the laser beams. FIG. 1 shows the results obtained by irradiating the transparent conductive oxide films with the laser beams, while the pulse numbers of which were changed among 1, 2, 3 and 4 pulses.

As shown in FIG. 1, the sheet resistance values tend to be increased by irradiation with the laser beams when the laser intensity levels are in excess of 1.0 J/cm$^2$. In a range of laser intensity of 0.1 to 1.0 J/cm$^2$, on the other hand, a region is observed where the sheet resistance values are reduced by irradiation with the laser beams. Further, the sheet resistance values are remarkably reduced as the pulse numbers are increased.

Figure 2:
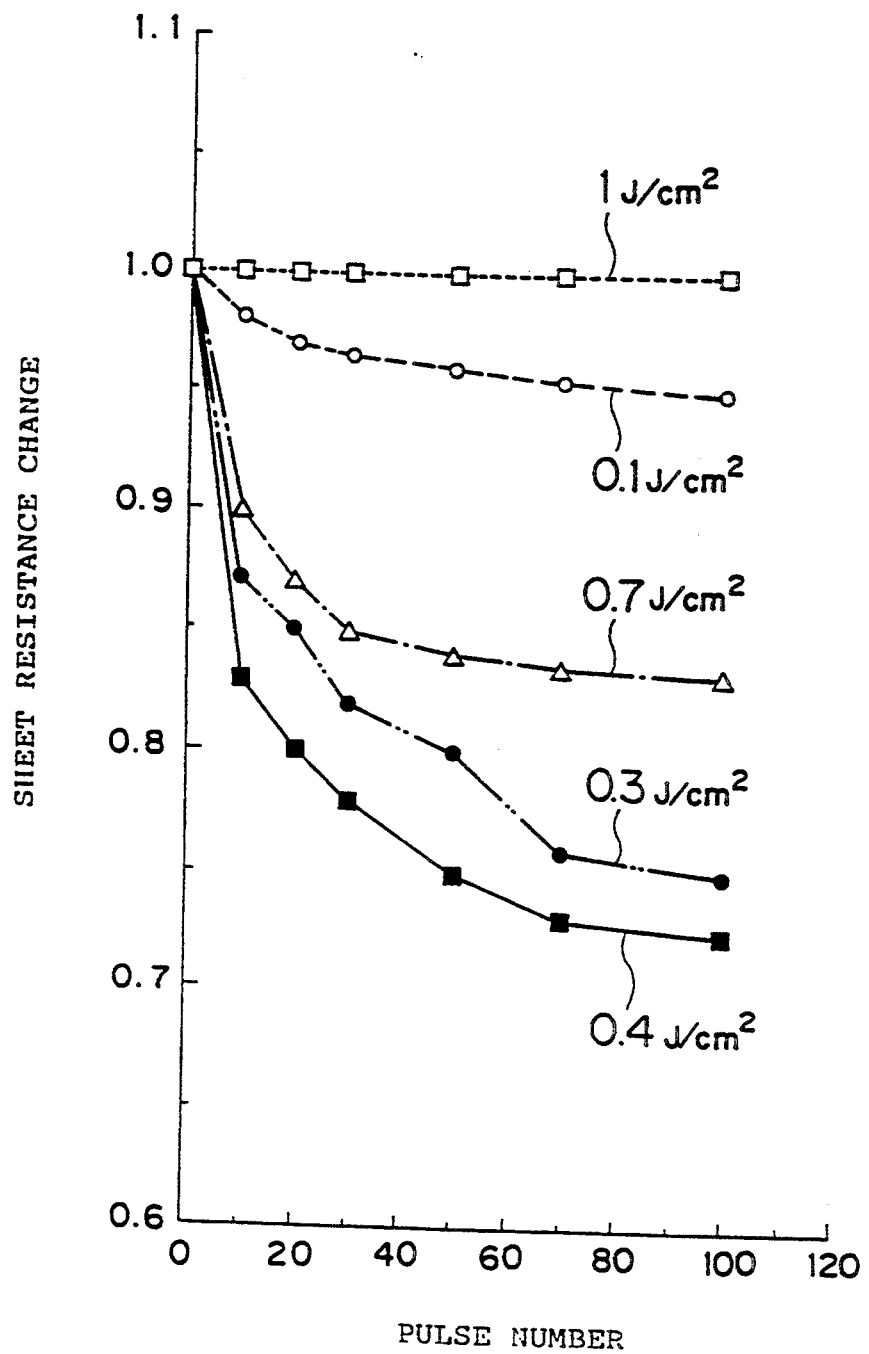
FIG. 2 is a graph illustrating relations between laser irradiation pulse numbers and changes of sheet resistance values of transparent conductive oxide films irradiated with laser beams according to the present invention.

Referring to FIG. 2, the data appearing in FIG. 1 within the range of 0.1 to 1.0 J/cm$^2$ are expressed in respective relations between the pulse numbers of the laser irradiation and the changes of the sheet resistance values. As clearly understood from FIG. 2, the sheet resistance values are reduced as the irradiation pulse numbers are increased. It is also understood that the reduction of the sheet resistance values is saturated when the irradiation pulse numbers exceed about 100 pulses.

While an energy beam is employed for patterning the shape of a transparent conductive oxide film or the like, such an energy beam has an intensity of at least 1.0 J/cm$^2$. As obvious from the results shown in FIGS. 1 and 2, therefore, it is understood that the effect of reducing the resistance of the transparent conductive oxide film according to the present invention is attained only with beam intensities within a prescribed range.

Figure 3:
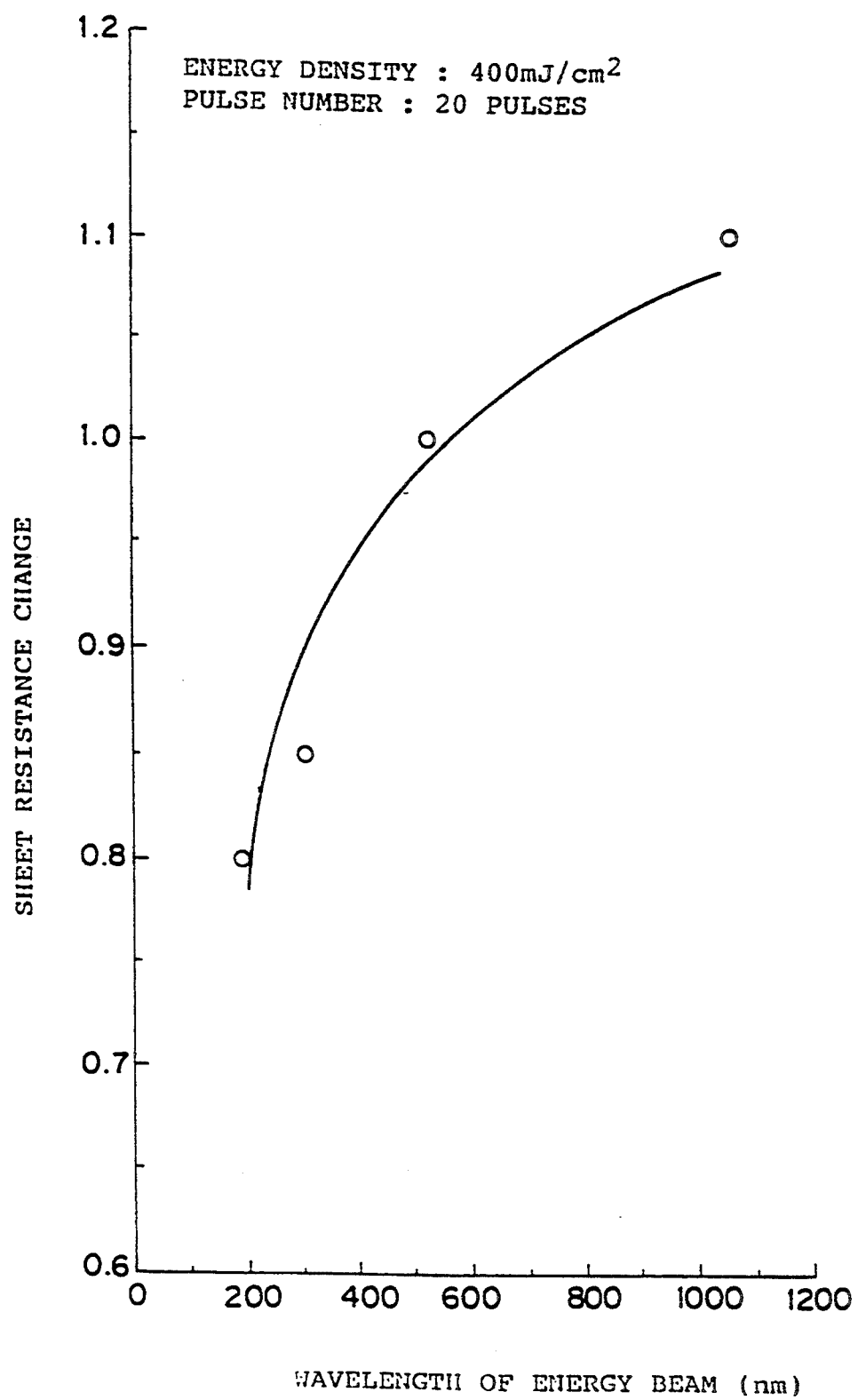
FIG. 3 is a graph illustrating relations between wavelengths of laser beams and changes of sheet resistance values of transparent conductive oxide films irradiated with such laser beams according to the present invention.

FIG. 3 shows changes of sheet resistance values of transparent conductive oxide films that were irradiated with various energy beams. The energy beams were generated by an ArF excimer laser beam of 193 nm wavelength, an XeCl excimer laser beam of 308 nm wavelength, a second harmonic of a YAG laser of 530 nm wavelength, and a YAG laser beam of 1060 nm wavelength respectively.

It is clearly understood from FIG. 3 that the effect of reducing the resistance of the transparent conductive oxide film is diminished with an increase of wavelength of the laser beams, and this effect can hardly be observed at wavelengths exceeding 530 nm. Thus, it is understood that an energy beam having a wavelength of not more than 400 nm is preferably used to irradiate the oxide film in order to reduce the resistance.

Figure 4:
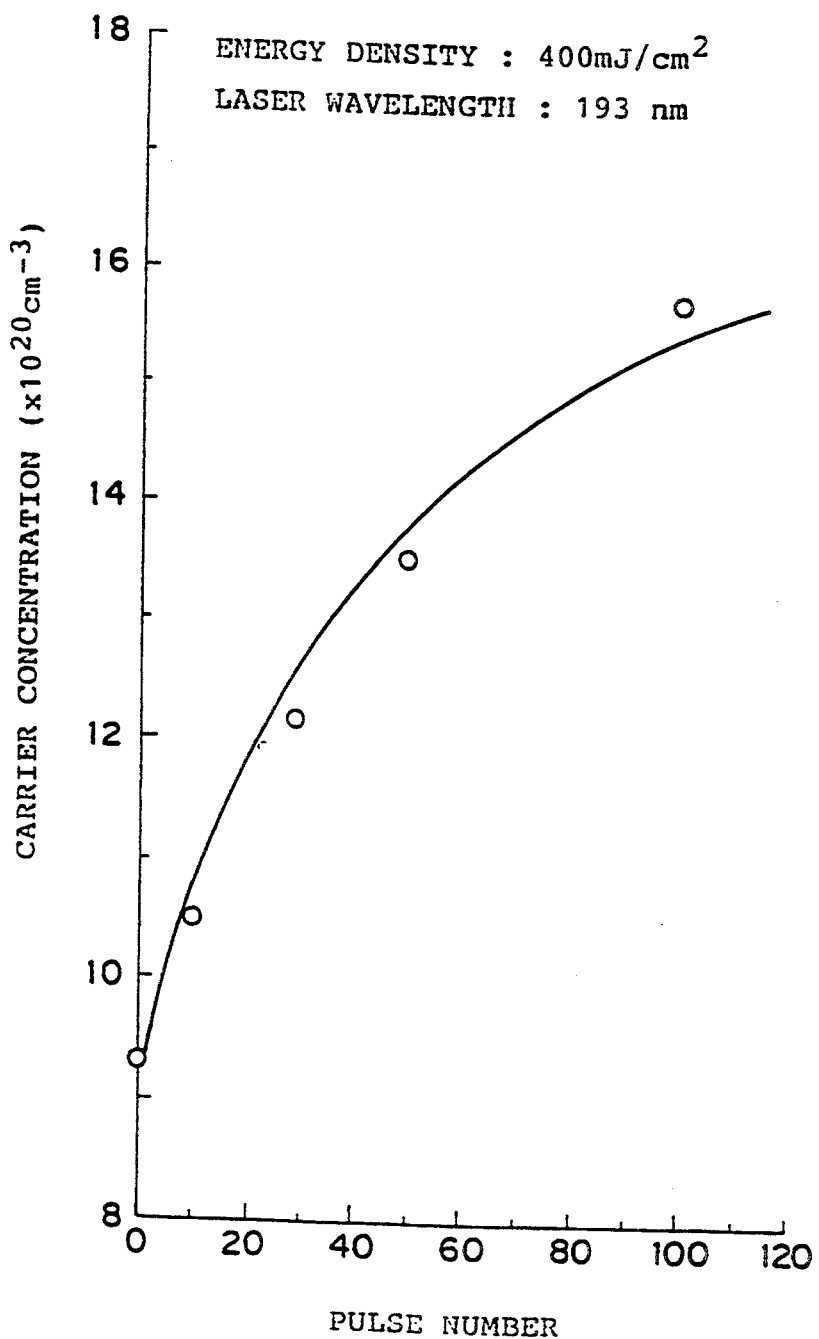
FIG. 4 is a graph illustrating relations between pulse numbers of laser beams used to irradiate transparent conductive oxide films according to the present invention and carrier concentration values in the transparent conductive film.

The inventors have examined the characteristics of films irradiated with energy beams, in order to investigate the cause of the effect of reducing the resistance. FIG. 4 shows the results of carrier concentration values measured in the respective samples employed in FIG. 2. As clearly understood from FIG. 4, the carrier concentration values increase with an increase of the irradiation pulse numbers. Thus, it is conceivable that the effect of reduction in resistance is implemented by such an increase of the carrier concentration.

It is understood from FIG. 4 that the carrier concentration of a transparent conductive oxide film is increased according to the present invention by about 20 to 60% as compared with a conventional case. For example, a typical or general carrier concentration of about $1.0 \times 10^{21}$ cm$^{-3}$ is increased to about $1.6 \times 10^{21}$ cm$^{-3}$. Such carrier concentrations can be evaluated by measuring the electric characteristics.

Regarding this increase of carrier concentration, absolutely the same effect was obtained whether the energy beam was irradiated onto the oxide film in the air or in a vacuum. Thus, it is believed that the carrier concentration is not increased by doping with an impurity caused by irradiation with the energy beam.

Each of the transparent conductive oxide films irradiated with the energy beams according to the aforementioned example was analyzed by electron spectroscopy, whereby carbon (C) and a carbide were detected in addition to Sn and O forming tin oxide ($SnO_2$). Since no carbide was detected from the tin oxide before irradiation with the energy beam, the carbide may have been generated from carbon that had been mixed in the film and that was activated by a reaction gas such as $CF_3Br$ or $CHClF_2$, for example, which was employed in formation of the film of tin oxide, due to irradiation with the energy beam. Thus, the effect of a reduction in resistance of the transparent conductive oxide film according to the present invention conceivably results from activation of carbon contained in the film caused by irradiation with the energy beam.

The reason that no reduction in resistance was observed in the transparent conductive oxide film irradiated with the energy beam having an intensity exceeding a preferable level, is conceivably that the film quality was extremely changed by melting of the film in addition to the aforementioned activation of the carbon, or the carbon mixable in the film was evaporated by irradiation with the energy beam.

Figure 5A:
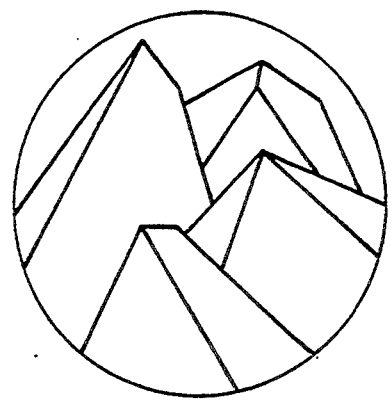
FIGS. 5A to 5D are schematic perspective views illustrating surface states of a transparent conductive oxide film irradiated with energy beam according to the present invention.
Figure 5B:
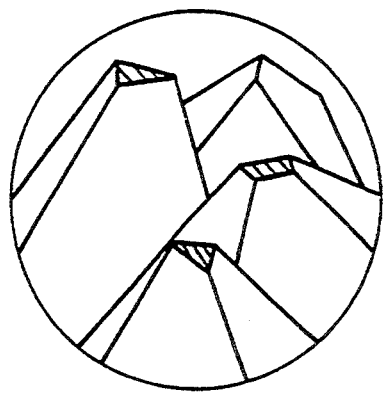
Figure 5C:
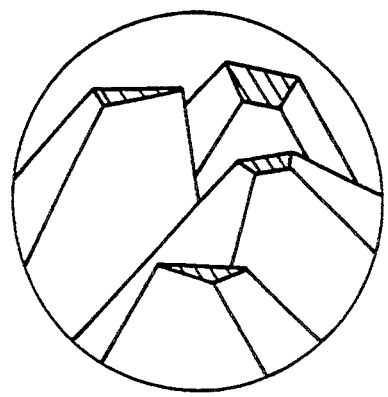
Figure 5D:
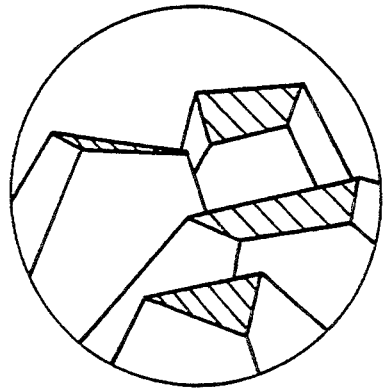

FIGS. 5A to 5D illustrate changes of surface states or textures of a transparent conductive oxide film that was irradiated with an energy beam having an energy density of 0.4 J/cm$^2$ according to the present invention, observed with a scanning electron microscope. FIG. 5A illustrates a state before irradiation with a laser beam. FIG. 5B illustrates a state after irradiation with the laser beam for 10 pulses. FIG. 5C illustrates a state after irradiation with the laser beam for 30 pulses. FIG. 5D illustrates a state after irradiation with the laser beam for 100 pulses.

As clearly understood from FIGS. 5A to 5D, the shapes of oxide crystal grains forming the transparent conductive oxide film were smoothed increasingly with the increase in the pulse number of the laser beam. Sharp projecting end portions observed in the unirradiated state shown in FIG. 5A were so smoothed that the crystal grains were rounded as a whole. On the other hand, the grain sizes of the crystal grains forming the transparent conductive oxide film themselves remained unchanged. As to the changes in shape of the crystal grains, it is conceivable that the sharp portions of the crystal grains were decomposed and scattered by irradiation with the energy beam, and hence such sharp portions disappeared to provide smooth grain shapes as a whole.

When a semiconductor film is formed on a transparent conductive oxide film, this semiconductor film, which is an extremely thin film of not more than 1 μm thickness, may be broken if the transparent conductive oxide film has sharp portions. Such sharp portions of the transparent conductive oxide film can be removed by irradiation with the energy beam in accordance with the present invention, to provide a smooth texture shape as a whole, whereby it is possible to attain a texture shape causing effective bending with respect to incident light without breaking the semiconductor film, dissimilarly to the above.

A transparent conductive oxide film was irradiated with an energy beam according to the present invention and changes in transmittance of the film were measured, whereby substantially no change was observed before and after irradiation with the energy beam. According to the present invention, therefore, it is possible to reduce resistance of a transparent conductive oxide film without reducing its transmittance while smoothing sharp portions of crystal grains forming the transparent conductive oxide, thereby providing a film having a smooth texture shape.

Figure 6A:
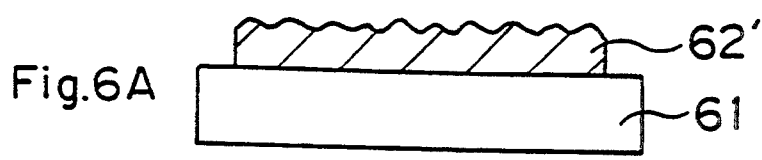
FIGS. 6A to 6D are sectional views showing a method of manufacturing a photovoltaic device according to a first embodiment of the present invention.

FIGS. 6A to 6D are sectional views showing a method of manufacturing a photovoltaic device according to a first embodiment of the present invention. Referring to FIG. 6A, a film of tin oxide is formed on a substrate 61 of glass with a thickness of about 4000 Å, to define a transparent conductive oxide film 62'. This thin film of tin oxide is formed by thermal CVD with a raw material gas, a doping gas and a doping ratio that are identical to those described above. The transparent conductive oxide film 62' may be subjected to chemical treatment with a strong acid to increase the degree of texture on its surface.

Figure 6B:
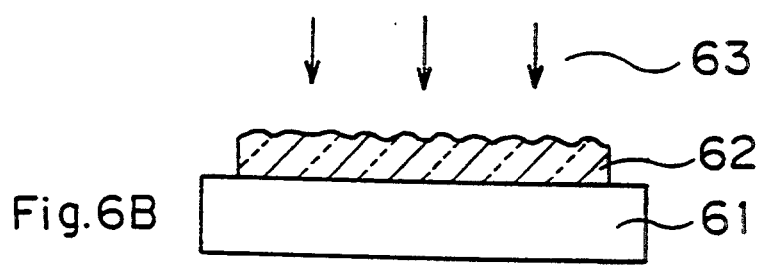

Referring to FIG. 6B, the transparent conductive oxide film 62' is irradiated with an XeCl excimer laser beam 63 from a film forming side with a laser intensity of about 400 mJ/cm$^2$. Thus, the transparent conductive oxide film 62' is modified in film quality and converted to a transparent conductive oxide film 62 having low resistance. The transparent conductive oxide film 62 thus irradiated with the laser beam 63 has no projections defined by sharp crystal grains on its surface, dissimilarly to the film 62' formed by thermal CVD, but has a smooth texture shape.

Figure 6C:
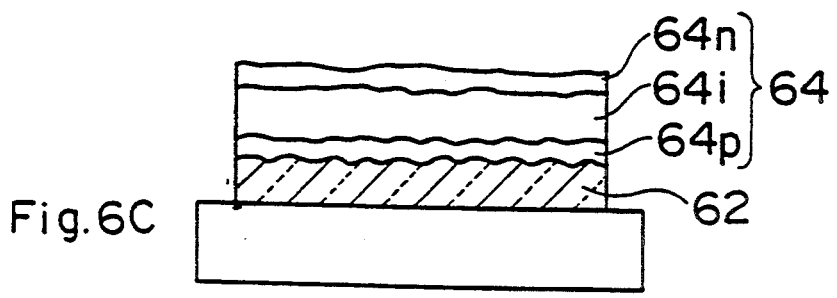

Then, a photoelectric conversion layer 64 is formed on the transparent conductive oxide film 62, as shown in FIG. 6C. The photoelectric conversion layer 64, which is made of amorphous silicon, is formed by a laminate of a p-type amorphous silicon film 64$p$, an i-type amorphous silicon film 64$i$ and an n-type amorphous silicon film 64$n$.

Figure 6D:
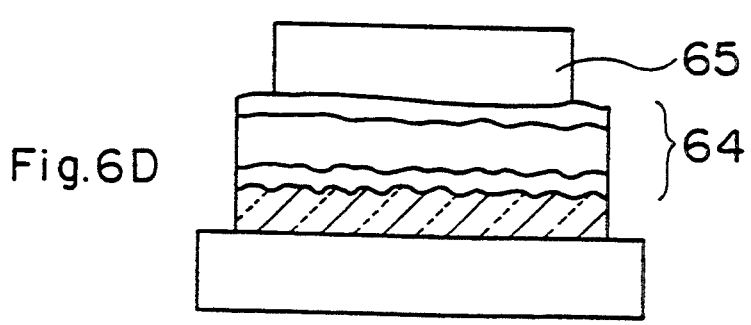

Finally, a back-side electrode film 65 of aluminum or titanium is formed on the photoelectric conversion layer 64, as shown in FIG. 6D.

Figure 7:
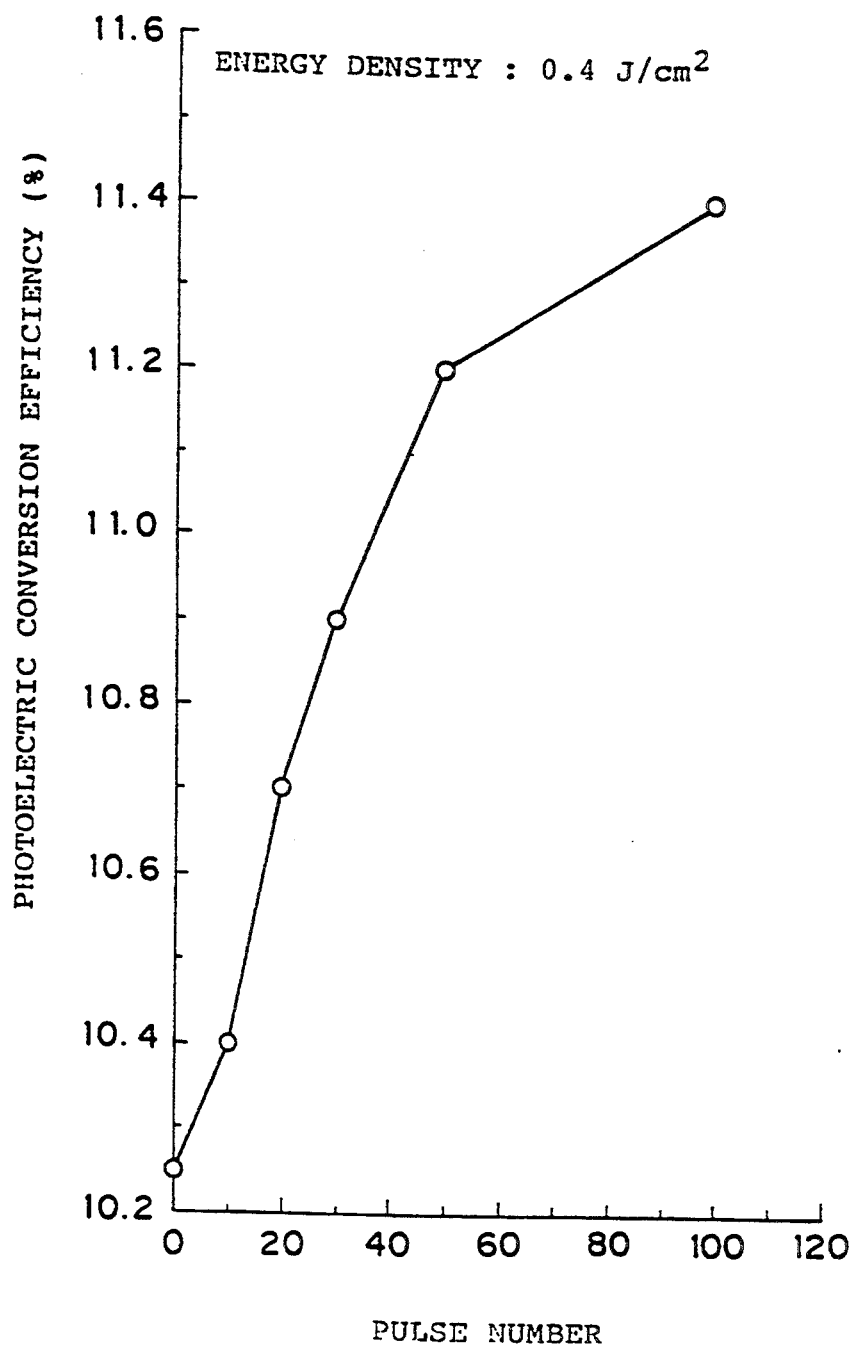
FIG. 7 is a graph illustrating a relation between the photoelectric conversion efficiency of a photovoltaic device obtained according to the inventive manufacturing method and an irradiation pulse number of an energy beam.

FIG. 7 illustrates a relation between the photoelectric conversion efficiency of photovoltaic devices, manufactured with different pulse numbers of a laser beam as shown in FIG. 6B, and the pulse number. It is understood that the photoelectric conversion efficiency is improved with increasing pulse number. This is conceivably because the resistance of the transparent conductive oxide film is reduced by irradiation with the laser beam to reduce the series resistance of the photovoltaic device, thereby improving the photoelectric conversion efficiency as a result. In particular, such an improvement of the photoelectric conversion efficiency is based on an improvement of the curve factor among solar cell characteristics.

It is understood that the photoelectric conversion efficiency of the photovoltaic device is improved to about 1.1 times as compared with that having a transparent conductive film not irradiated with an energy beam.

Figure 8A:
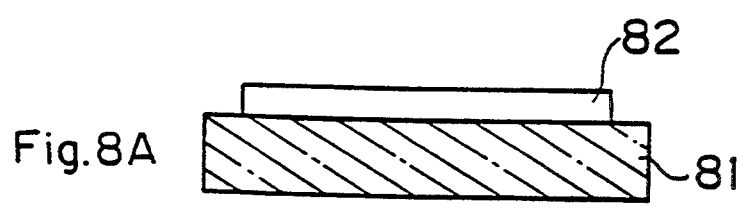
FIGS. 8A to 8C are sectional views showing a method of manufacturing a photovoltaic device according to a second embodiment of the present invention.
Figure 8B:
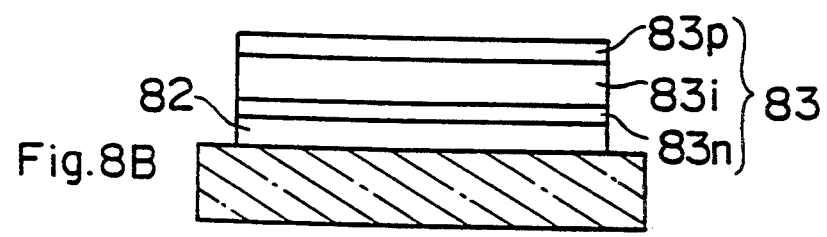
Figure 8C:
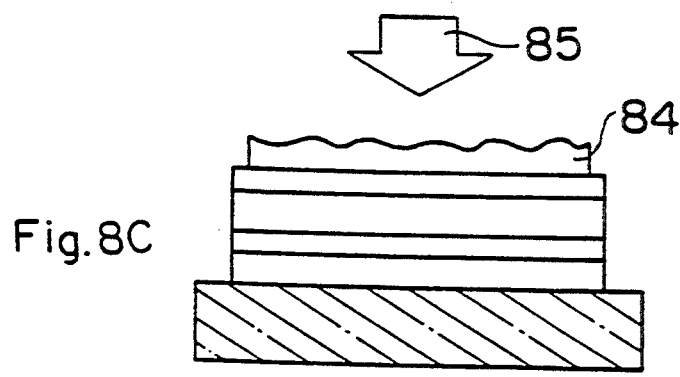

FIGS. 8A to 8C are sectional views showing a method of manufacturing a photovoltaic device according to a second embodiment of the present invention.

According to this embodiment, a photoelectric conversion layer 83 and a metal electrode 82 are formed on a substrate 81 and a transparent conductive oxide film 84 is formed on the photoelectric conversion layer 83, so that light 85 is introduced from the side of the transparent conductive oxide film 84.

Referring to FIG. 8A, the metal electrode 82 of silver, aluminum or titanium is formed on the substrate 81 such as a glass substrate, a ceramic substrate or a stainless steel substrate having an insulated surface, to be about 1000 Å to 1 μm in thickness.

Then, the photoelectric conversion layer 83 is formed on the metal electrode 82, as shown in FIG. 8B. According to this embodiment, the photoelectric conversion layer 83 is prepared from an amorphous silicon film of 2000 to 7000 Å thickness. This photoelectric conversion, layer 83 is formed of an n-type amorphous silicon film 83$n$, an i-type amorphous silicon film 83$i$ and a p-type amorphous silicon film 83$p$.

Referring to FIG. 8C, the transparent conductive oxide film 84 of tin oxide having a thickness of 2000 to 6000 Å is formed on the photo electric conversion layer 83. In general, the transparent conductive oxide film 84 has a relatively flat surface, since chemical treatment with a strong acid cannot be performed, dissimilarly to the transparent conductive oxide film 62' shown in FIG. 6A. The present transparent conductive oxide film 84 is irradiated with an energy beam 85 having a beam profile of a texture shape, whereby the oxide film 84 is reduced in resistance and provided with a texture on its surface by ablation. The energy beam 85 is emitted from an XeCl excimer laser with an intensity of about 400 mJ/cm$^2$ to form a lattice pattern. The shape of the texture that is formed on the transparent conductive oxide film 84 can be controlled by correspondingly controlling conditions for irradiating the film with the energy beam 85. Particularly when an energy beam 85 with a wavelength of not more than 400 nm and with an intensity of 0.1 to 1.0 J/cm$^2$ is used for the irradiation, it is possible to reduce the resistance of the transparent conductive oxide film 84 as well as to control the shape of the texture that is formed on this film in response to the irradiation pulse number.

In the photovoltaic device shown in FIG. 8C, portions having a high carrier concentration are formed on the surface of the transparent conductive oxide film 84 in the form or pattern of a lattice. Such a carrier concentration can be evaluated by measuring the electric characteristics.

Figure 9A:
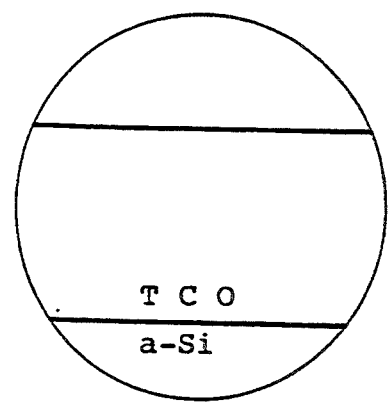
FIGS. 9A to 9D are model diagrams showing relations between irradiation pulse numbers of an energy beam and degrees of texture formed on a surface of a transparent conductive oxide film irradiated with such an energy beam according to the present invention.
Figure 9B:
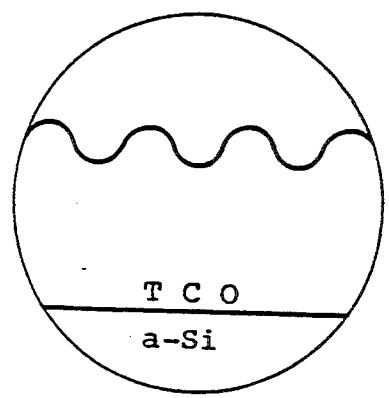
Figure 9C:
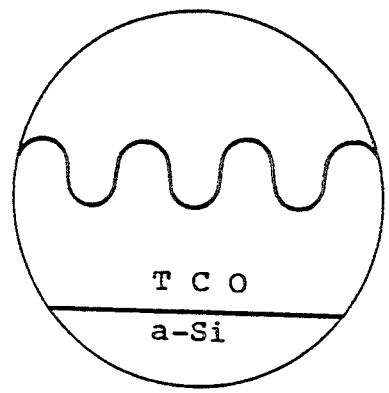
Figure 9D:
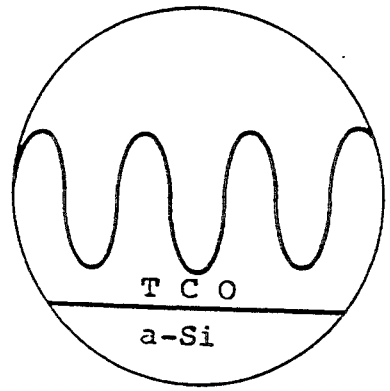

FIGS. 9A to 9D are model diagrams showing relations between irradiation pulse numbers of an energy beam having an energy density of 0.4 J/cm$^2$ and the resulting degrees of texture shapes on a surface of a transparent conductive oxide (TCO) film irradiated with such energy beams. FIG. 9A shows an unirradiated state of the film. FIG. 9B shows a state of the film irradiated with the energy beam 10 times. FIG. 9C shows a state of the film irradiated with the energy beam 30 times. FIG. 9D shows a state of the film irradiated with the energy beam 100 times. As clearly understood from FIGS. 9A to 9D, it is possible to form a texture on the surface of a transparent conductive film by irradiation with an energy beam. Thus, an optical path of light that is incident on a photoelectric conversion layer through such a transparent conductive oxide film is bent at the surface of the transparent conductive film, so that the light is effectively absorbed by the photoelectric conversion layer.

The texture, which results from ablation by the energy beam is larger or coarser than that based on the shapes of the crystal grains shown in FIGS. 5A to 5D.

Figure 10A:
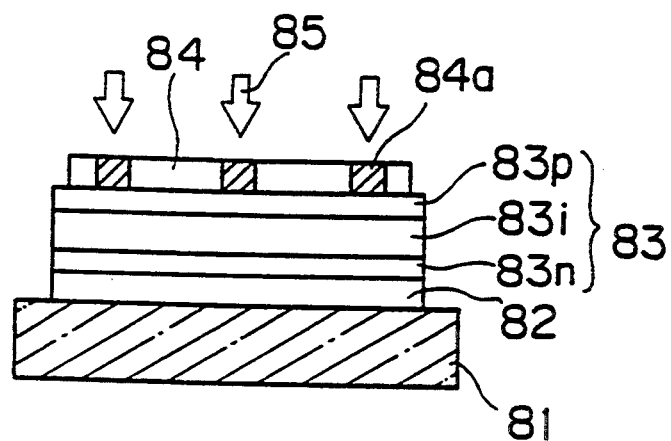
FIGS. 10A and 10B are a sectional view and a plan view illustrating a method of manufacturing a photovoltaic device according to a third embodiment of the present invention.
Figure 10B:
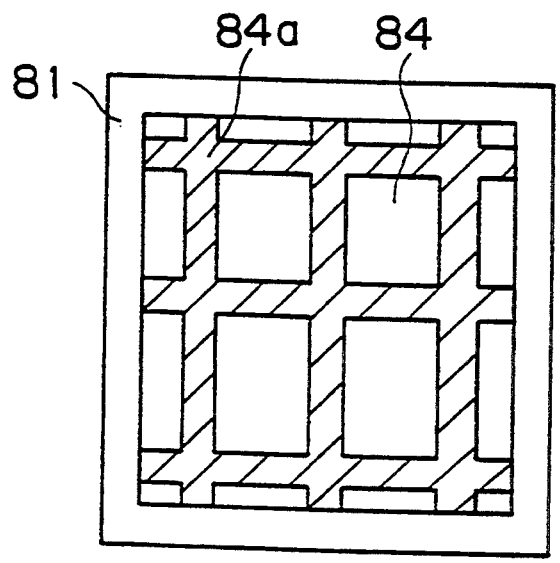

FIGS. 10A and 10B are a sectional view and a plan view illustrating a method of manufacturing a photovoltaic device according to a third embodiment of the present invention. Referring to FIGS. 10A and 10B, a metal electrode 82 of silver, aluminum or titanium is formed on a substrate 81 such as a glass substrate, a ceramic substrate or a stainless steel substrate having an insulated surface, to be about 1000 Å to 1 μm in thickness. A photoelectric conversion layer 83 is formed on the metal electrode 82 by an amorphous silicon film of about 2000 to 7000 Å in thickness. This photoelectric conversion layer 83 is formed of an n-type amorphous silicon film 83n, an i-type amorphous silicon film 83i and a p-type amorphous silicon film 83p.

A transparent conductive oxide film 84 of tin oxide is formed on the photoelectric conversion layer 83 in a thickness of 2000 to 6000 Å. Only parts 84a of the surface of the transparent conductive oxide film 84 are irradiated with an energy beam 85, so that only the irradiated parts 84a are reduced in resistance to define a collector electrode for collecting carriers in the photovoltaic device. As shown in FIG. 10B, the irradiated parts 84a are in the form or pattern of a lattice. In general, a collector electrode is formed by a metal film, which disadvantageously screens incident light to cause optical loss. According to the present invention, however, parts of the transparent conductive oxide film are adapted to define a collector electrode having excellent light transmittance, whereby no optical loss is caused, unlike in the conventional case.

Further, the shape of the collector electrode can be defined by irradiation with the energy beam, whereby it is possible to carry out precise control in formation of the collector electrode. Thus, it is possible to solve problems involving patterning of a conventional collector electrode formed by screen printing.

Figure 11:
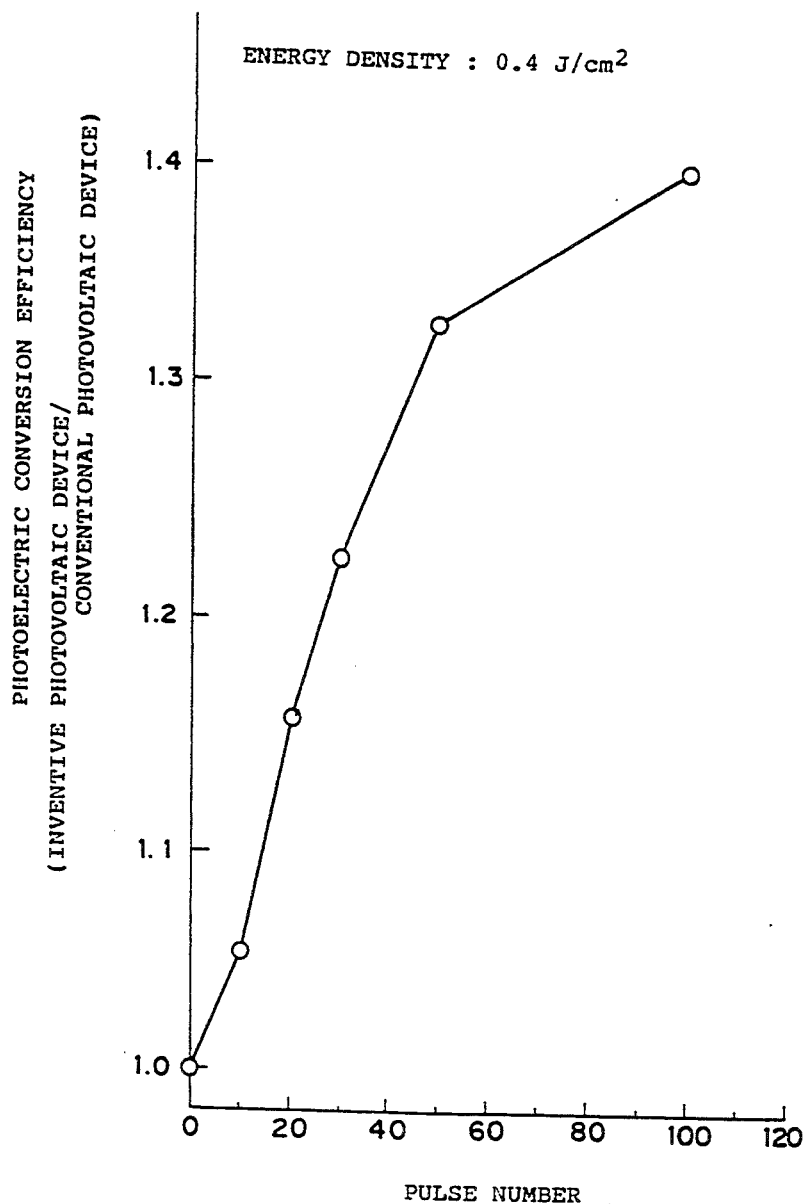
FIG. 11 is a graph illustrating a relation between an irradiation pulse number of an energy beam and photoelectric conversion efficiency in steps of manufacturing the photovoltaic device having the structure shown in FIGS. 10A and 10B.
Figure 12:
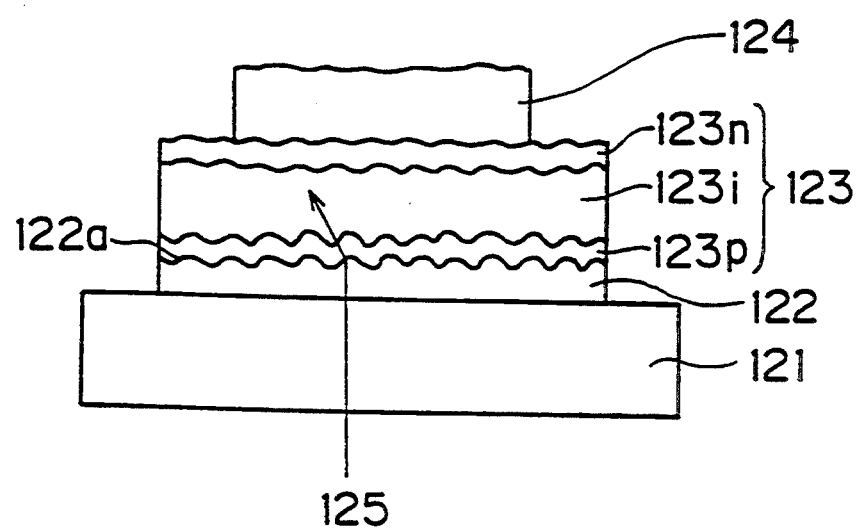
FIG. 12 is a sectional view illustrating a step of manufacturing a conventional photovoltaic device.

FIG. 11 illustrates a relation between a pulse number of an energy beam which was used to irradiate the transparent conductive oxide film in the photovoltaic device according to the third embodiment of the present invention shown in FIGS. 10A and 10B and the resulting photoelectric conversion efficiency of the as-obtained photovoltaic device. Referring to FIG. 11, the axis of the abscissas shows the irradiation pulse number of the energy beam employed for modifying the transparent conductive oxide film, and the axis of ordinates shows a ratio of photoelectric conversion efficiency of the photovoltaic device according to this embodiment relative to a conventional photovoltaic device. The conventional photovoltaic device was provided with a collector electrode of a metal having the same area as regions irradiated with an energy beam in the present embodiment of the invention, while the device of the present embodiment had a collector, formed by irradiating the transparent conductive oxide film with the energy beam.

As clearly understood from FIG. 11, the ratio of photoelectric conversion efficiency is increased in proportion to the irradiation pulse number of the energy beam, to reach about 1.4 times at 100 pulses. This is because parts of the transparent conductive oxide film arranged on a light incident side were irradiated with the energy beam in such a manner that the irradiated parts were reduced in resistance, provided with a texture on surfaces thereof for improving the efficiency of collecting light, and supplied with functions for defining a collector electrode for collecting photogenerated carriers, whereby it was possible to increase the effective area for photoelectric conversion with no optical loss, dissimilarly to the conventional photovoltaic device.

While the transparent conductive oxide film is prepared from tin oxide in each of the aforementioned embodiments, the inventors have also made similar experiments using indium tin oxide and zinc oxide. At first the inventors predicted that the effect of reducing the sheet resistance would not be observed when using indium tin oxide or zinc oxide, dissimilarly to the case of tin oxide, because the reactive gas employed in forming a transparent conductive oxide film of those materials contains no carbon. According to experiments made by the inventors, however, it has been confirmed that the effect of reducing the resistance according to the present invention is also observed in relation to each of indium tin oxide and zinc oxide, although the degree of the effect is slightly different from that of tin oxide. While the reason for this has not yet been clarified in detail, it is conceivable that an unidentified element contained in the film in place of carbon contained in tin oxide, is activated by irradiation with an energy beam to provide an effect similar to that of tin oxide.

It is also conceivable that in addition to such activation of an element, the grain boundaries between crystal grains forming the transparent conductive oxide film are improved by irradiation with the energy beam to facilitate the drifting of carriers and to reduce the resistance.

Although the energy beam is a laser beam in each of the aforementioned embodiments, the present invention is not restricted to a laser beam but another energy beam such as an electron beam is also employable. Further, although the energy beam is applied mainly in a vacuum in each of the aforementioned embodiments, an inert gas may alternatively be employed to form the atmosphere for irradiating the transparent conductive oxide film with the energy beam. While the transparent conductive oxide film is irradiated with the energy beam at room temperature in each of the aforementioned embodiments, it has been confirmed that a similar tendency is also observed when the transparent conductive oxide film is slightly heated and irradiated with the energy beam, to attain an effect of reducing the resistance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of modifying a transparent conductive oxide film, comprising the steps of: emitting an energy beam from an energy beam generating device; and irradiating said transparent conductive oxide film with said energy beam, thereby increasing the carrier concentration and reducing the resistance in said film.

2. The modifying method in accordance with claim 1, wherein said energy beam has a wavelength not greater than 400 nm.

3. The modifying method in accordance with claim 1, wherein said energy beam has an intensity within the range from 0.1 to 1.0 J/cm$^2$.

4. The modifying method in accordance with claim 1, wherein said oxide film has an initial surface texture and wherein said step of irradiating said oxide film achieves a softening of the degree of said texture.

5. The modifying method in accordance with claim 1, wherein said transparent conductive oxide film is made of tin oxide.

6. The modifying method in accordance with claim 1, wherein said transparent conductive oxide film is made of indium tin oxide.

7. A method of manufacturing a photovoltaic device, comprising the steps of: forming a transparent conductive oxide film on a substrate; irradiating said transparent conductive oxide film with an energy beam thereby increasing the carrier concentration and reducing the resistance in said film; forming a photoelectric conversion layer having at least one p-n junction on said transparent conductive oxide film; and forming an electrode film on said photoelectric conversion layer.

8. The manufacturing method in accordance with claim 7, wherein said energy beam has a wavelength not greater than 400 nm.

9. The manufacturing method in accordance with claim 7, wherein said energy beam has an intensity within the range from 0.1 to 1.0 J/cm$^2$.

10. The manufacturing method in accordance with claim 7, wherein said oxide film has an initial surface texture and wherein said step of irradiating said oxide film achieves a softening of the degree of said texture.

11. The manufacturing method in accordance with claim 7, wherein said transparent conductive oxide film is made of tin oxide.

12. The manufacturing method in accordance with claim 7, wherein said transparent conductive oxide film is made of indium tin oxide.

13. A method of manufacturing a photovoltaic device, comprising the steps of: forming an electrode film on a substrate; forming a photoelectric conversion layer having at least one p-n junction on said electrode film; forming a transparent conductive oxide film on said photoelectric conversion layer; and irradiating said transparent conductive oxide film with an energy beam thereby increasing the carrier concentration and reducing the resistance in said film.

14. The manufacturing method in accordance with claim 13, wherein said step of irradiating said oxide film effects forming a texture on an irradiated portion of said oxide film.

15. The manufacturing method in accordance with claim 13, wherein said step of irradiating said oxide film comprises irradiating a part of said oxide film with said energy beam for converting said irradiated part to a collector electrode for collecting carriers.

16. The manufacturing method in accordance with claim 13, wherein said energy beam has a wavelength not greater than 400 nm.

17. The manufacturing method in accordance with claim 13, wherein said energy beam has an intensity within the range from 0.1 to 1.0 J/cm$^2$.

18. The manufacturing method in accordance with claim 13, wherein said transparent conductive oxide film is made of tin oxide.

19. The manufacturing method in accordance with claim 13, wherein said transparent conductive oxide film is made of indium tin oxide.

20. The modifying method in accordance with claim 1, wherein said step of irradiating said oxide film is carried out over substantially the entire area of said oxide film, thereby increasing the carrier concentration and reducing the resistance substantially throughout said film.

* * * * *

UNITED STATES PATENT AND TRADEMARK OFFICE
CERTIFICATE OF CORRECTION

PATENT NO. : 5,413,959

DATED : May 9, 1995

INVENTOR(S) : Yamamoto et al.

It is certified that error appears in the above-identified patent and that said Letters Patent is hereby corrected as shown below:

Title page, items

[75] line 3, replace "Moriguchi" by --Osaka--.

[73] line 1, replace "Sayno Electric Co., Ltd.," by --Sanyo Electric Co., Ltd.,--.

[56] "References Cited", the date for U. S. Pat. 5,217,921 should be --6/1993--.

Signed and Sealed this

Twenty-second Day of August, 1995

Attest:

BRUCE LEHMAN

Attesting Officer     Commissioner of Patents and Trademarks